United States Patent [19]

Ikeda et al.

[11] Patent Number: 4,998,258
[45] Date of Patent: Mar. 5, 1991

[54] SEMICONDUCTOR LASER DEVICE

[75] Inventors: Kenji Ikeda; Kimio Shigihara; Yutaka Mihashi, all of Itami, Japan

[73] Assignee: Mitsubishi Denki Kabushiki Kaisha, Japan

[21] Appl. No.: 398,955

[22] Filed: Aug. 28, 1989

[30] Foreign Application Priority Data

Oct. 7, 1988 [JP] Japan .................................. 63-254345

[51] Int. Cl.$^5$ ............................................. H01S 3/19
[52] U.S. Cl. ......................................... 372/49; 372/46
[58] Field of Search ...................... 372/49, 46; 11/43

[56] References Cited

U.S. PATENT DOCUMENTS 4,001,719 1/1977 Krupka .................................. 372/49
4,100,508 7/1978 Wittke .................................. 372/49

FOREIGN PATENT DOCUMENTS 56-1589 1/1981 Japan .

OTHER PUBLICATIONS

Wittke et al., "Lateral Mode. Injection Lasers", Journal of Applied Physics, vol. 48, No. 7, Jul. 1977, pp. 3122-3144.

Ninagawa et al., "Mirror Reflectivity ... Semiconductor Lasers", Japanese Journal of Applied Physics, vol. 18, No. 5, May 1979, pp. 967-974.

Primary Examiner—Georgia Epps
Attorney, Agent, or Firm—Leydig, Voit & Mayer

[57] ABSTRACT

A semiconductor laser device provided with a broad light waveguide through which a higher order transverse oscillation modes can propagate, includes at least one of laser facet having a high reflectance region having a width of about 1/5 to ½ of the width of the light waveguide located at a central portion thereof and a low reflectance region having a lower reflectance than the high reflectance region located at both sides of the high reflectance region whereby higher order modes of oscillation can be suppressed.

7 Claims, 7 Drawing Sheets

SEMICONDUCTOR LASER DEVICE

FIELD OF THE INVENTION

The present invention relates to a semiconductor laser device and, more particularly, a laser producing a fundamental transverse mode oscillation at high power output.

BACKGROUND OF THE INVENTION

FIGS. 3(a) to 3(d) illustrate the construction and operation of a prior art semiconductor laser device. In FIG. 3, reference numeral 1 designates a semiconductor light waveguide path which generally corresponds to an active region. Reference numerals 2 and 3 designate coating layers at the cavity facets, and dielectric thin films are generally used therefor. Light is amplified while traveling through the light waveguide path 1. When the light reaches the facet 2, a portion thereof is emitted to the outside and the remaining portion thereof is reflected and again amplified while traveling through the light waveguide path 1. When the light reaches the facet 3, a portion thereof is emitted to the outside and the remaining portion thereof is again reflected and travels through the light waveguide path 1.

When the width d of the light waveguide path 1 shown in FIG. 3 is wide and a primary mode or a secondary mode of oscillation occur instead of the fundamental mode (0 order mode), the oscillation mode becomes unstable. The stability is attributed to a lack of uniformity in the; thickness and composition of the light waveguide path, the injected current density, and the temperature rise. Thus, in some cases a fundamental mode oscillation is produced but in other cases a primary order mode or a secondary order mode are obtained.

Figure 3A:
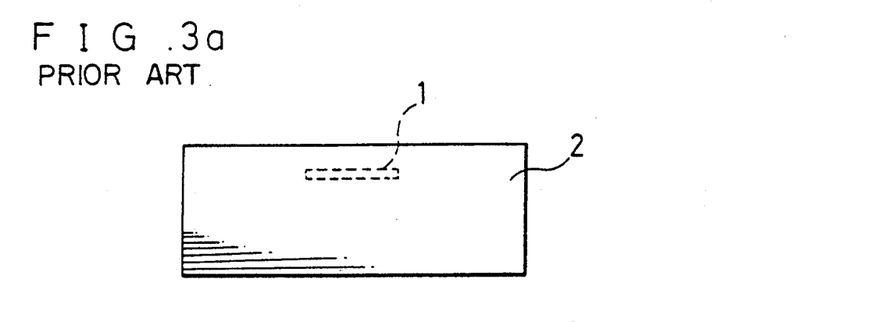
FIGS. 3(a) to 3(d) are diagrams illustrating a prior art semiconductor laser device and its operation.
Figure 3B:
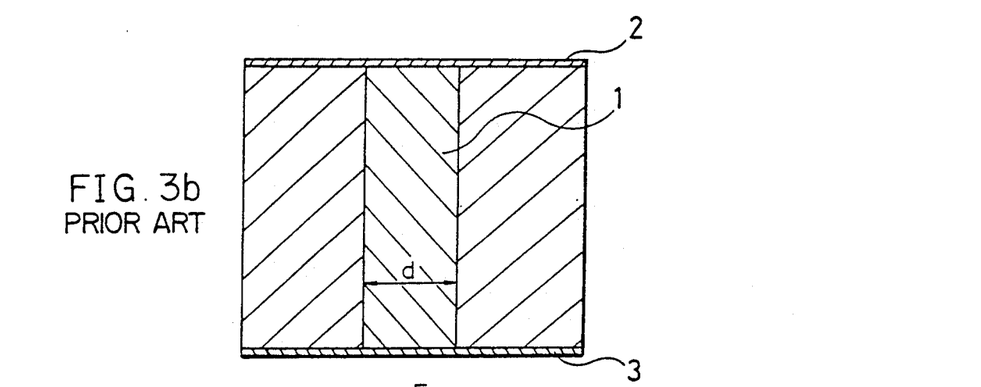
Figure 3C:
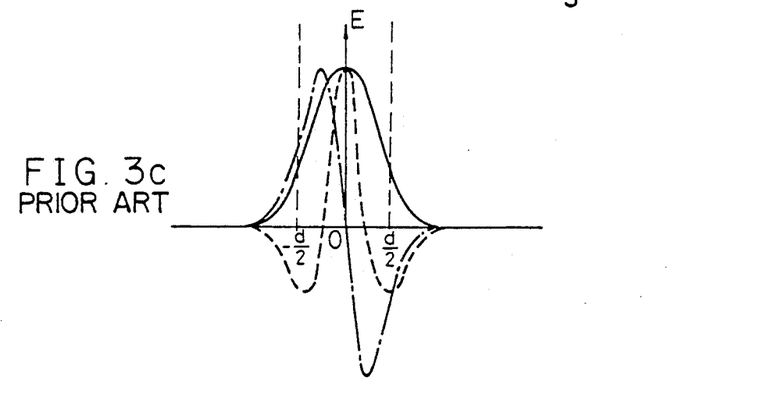

FIG. 3(c) shows an electric field distribution (transverse mode) of the zero order, the primary order, and the secondary order oscillation mode in the light waveguide path.

Figure 3D:
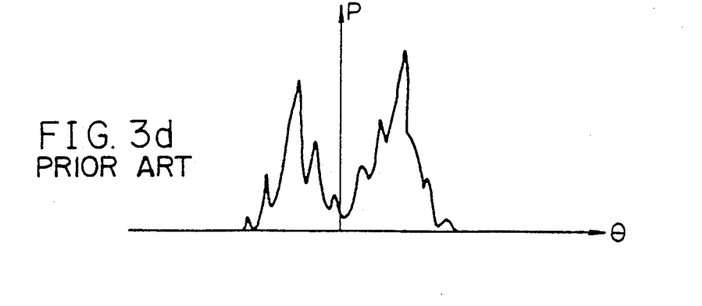

When the light waveguide path is widened to about 100 microns in order to obtain a high power output, a variety of higher order modes oscillate at the same time, and then the far-field radiation pattern is complicated and may have a plurality of peaks as shown in FIG. 3(d).

When the width of the light waveguide path is widened so that the higher order transverse oscillation modes are produced to obtain a high output, the laser beam cannot be focused to a point. Furthermore, the ratio of the light which is incident on an optical system to the total light output is low. Even in the same laser device the transverse oscillation modes vary and the laser behavior varies to a great extent because variations in the injection current and the temperature, whereby no linearity and no reproducibility of the characteristics are obtained.

SUMMARY OF THE INVENTION

The present invention is directed to solving the above-described problems and has for its object the provision of a semiconductor laser device capable of producing a high power light output and capable of controlling the transverse modes of oscillation.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a semiconductor laser device of the present invention, a broad width light waveguide path which allows the transmission of higher order transverse oscillation modes is provided. At least one of the facets of the light waveguide path includes a high reflectance region having a width of about 1/5 to ½ of the width of the light waveguid and located at a central portion of the light waveguide and a low reflectance region having a lower reflectance than the high reflectance region located on both side of the region. Therefore, the high reflectance reflectance of the lower order mode, that is, the ratio of the positive feedback of the lower order mode is increased, whereby a semiconductor laser producing a fundamental mode oscillation even at high power output is realized.

DETAILED DESCRIPTION OF THE PREFERRED EMBODIMENTS

An embodiment of the present invention will be described in detail with reference to the drawings.

Figure 1A:
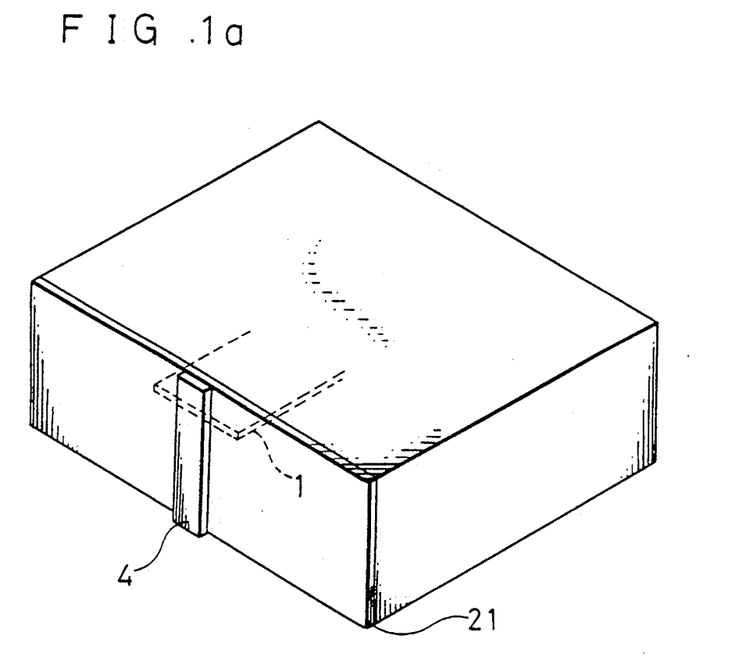
FIGS. 1(a) and 1(b)) are diagrams showing a perspective view, respectively, and a cross-sectional view of a semiconductor laser device according to a first embodiment of the present invention.
Figure 1B:
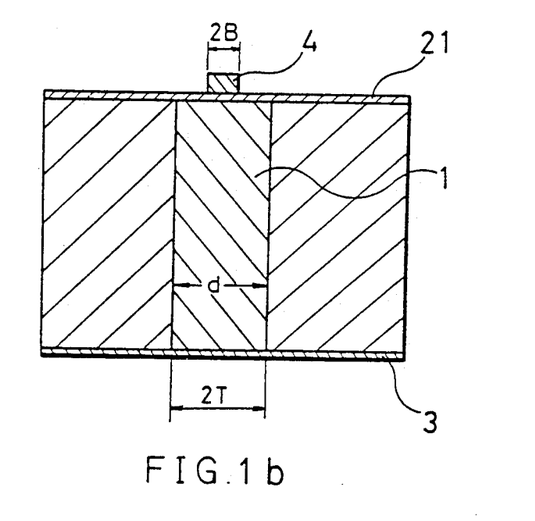

FIG. 1(a) shows a prospective view and FIG. 1(b) shows a sectional view of a semiconductor laser device according to a first embodiment of the present invention. FIG. 1(b) is a sectional plan view. In, FIGS. 1(a) and 1(b) reference numeral 1 designates a light waveguide, reference numeral 3 designates a rear facet coating layer, and reference numeral 21 designates a low reflectance coating layer at the front facet. A high reflectance region 4 is disposed on coating layer 21 at the central portion of the light waveguide 1.

The device will operate as follows.

In the semiconductor laser device having a wide light waveguide many transverse oscillation modes, such as zero order, a primary order, a secondary order, ... may propagate. Furthermore, there is almost no difference in the gains which are produced in these different order transverse oscillation modes. Accordingly, if the reflection at the facet is uniform, whether any of these transverse oscillation modes will be sustained depends on the slight differences in the modal gains of the oscillation modes. Usually, the 0 order mode is likely to oscillate, but transverse modes in a variety of order numbers will oscillate because slight nonuniformities exist in the reflectances as described above.

In the present invention, the facet reflectances of the respective transverse modes having different order numbers largely differ from each other. A high reflectance is provided only at the central portion of the light waveguide facets and low reflectances are provided elsewhere. Therefore, in the zero order mode which has a large amount of its power at the central part of its disbrution, the reflectance is higher than for the higher order modes of oscillation. Accordingly, the threshold current value is higher for the higher order modes, and oscillation in those higher order modes will not easily occur.

Figure 2:
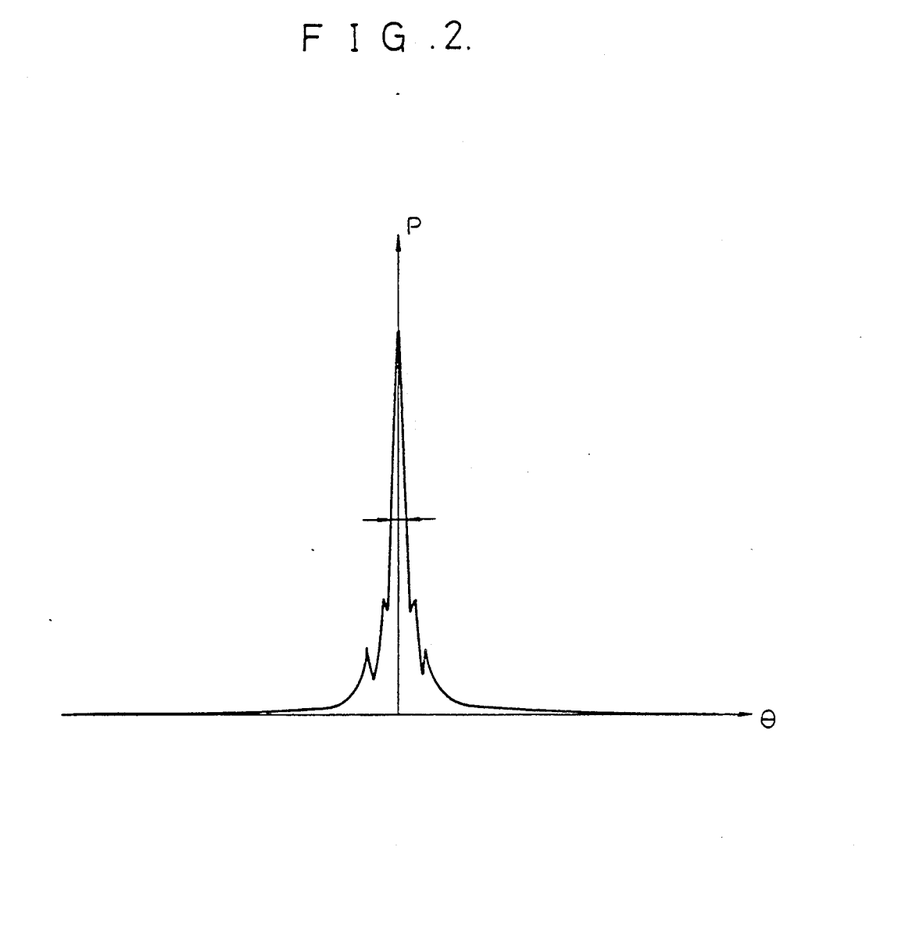
FIG. 2 is a diagram showing a far field radiation pattern of a laser according to the first embodiment of FIG. 1.

FIG. 2 shows an example of a far field radiation pattern of a semiconductor laser device according to the embodiment of FIGS. 1(a) and 1(b). This far field pattern shows a half peak power angle of about 1.5 degrees and only a single large central peak. This pattern means that the fundamental mode of oscillation is being sustained. Two small shoulders or peaks are seen at both sides of the central peak, respectively. These shoulders are interference fringes which are produced by diffracted light at the boundary between the high reflectance portion and the low reflectance portion of the facet.

The width of the high reflectance portion 4 will be considered. In an SBA (self-aligned bent active layer) type having an $Al_{0.15}Ga_{0.85}As$ active layer of 0.06 microns thickness and an $Al_{0.45}Ga_{0.55}As$ cladding layer, when the width 2T of the active region, that is, of the light waveguide, is 150 microns, the transverse modes allowed are the zero order, primary order, . . . 98th order. Among these transverse modes, if the fundamental mode has a sufficiently low current threshold compared with the other modes, the fundamental transverse oscillation mode can be selectively sustained.

Figure 5:
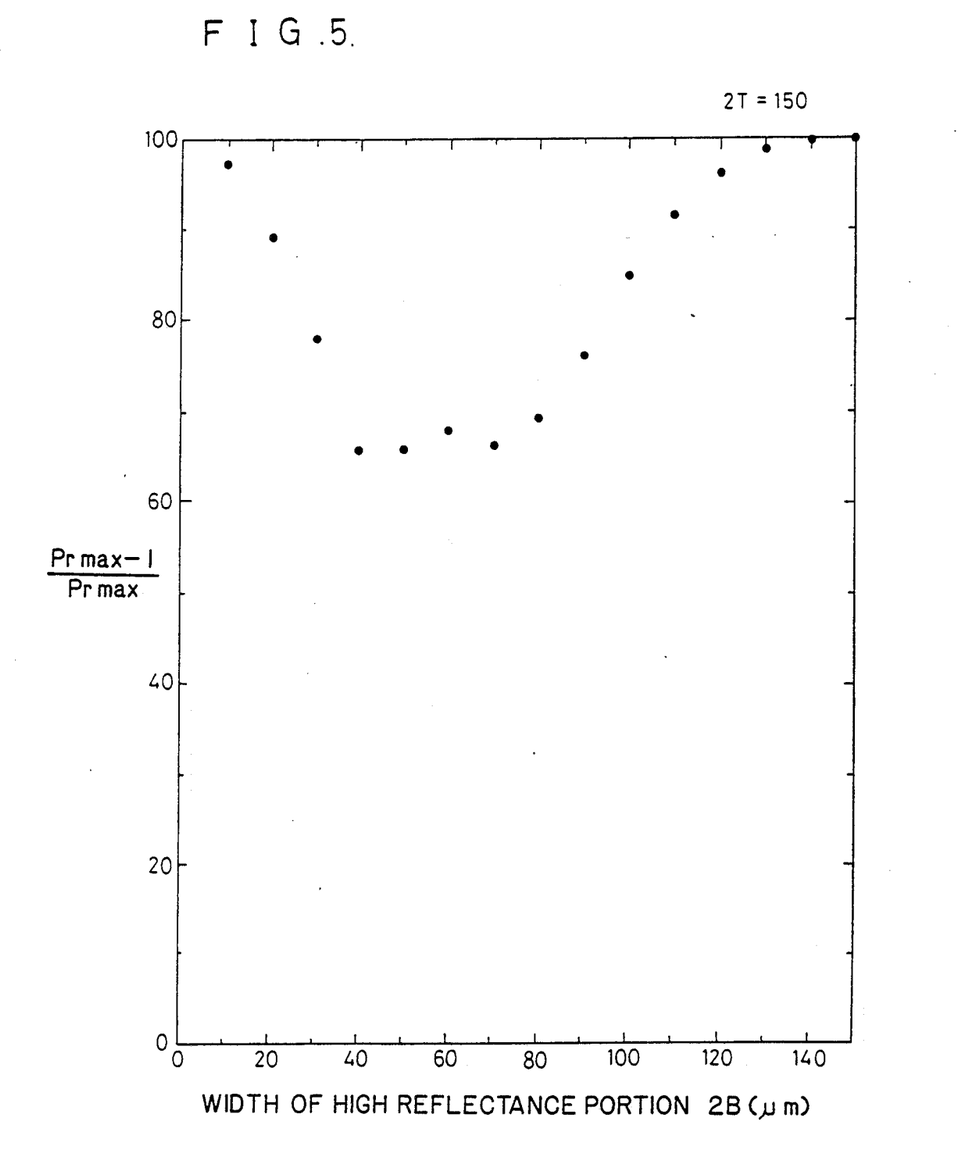
FIGS. 5 to 8 are diagrams showing the relationships between the ratio of the higher order mode reflectance to the fundamental mode reflectance and the width of the high reflectance region in semiconductor laser device having light waveguide widths of 150 microns, 20 microns, 30 microns, and 50 microns, respectively.

FIG. 5 shows a ratio of the reflectance to the fundamental (zero order) mode (overlapping integral of the standardized fundamental mode waveform and a rectangle of width 2B) to the reflectance of the mode having a secondary mode (overlapping integral of the higher order mode other than the standardized fundamental mode and the rectangle of width 2B) in a semiconductor laser in which the width 2T is 150 microns. A dielectric film coating of reflectance Rf is applied to the central portion of the light waveguide in a width of 2B. The reflectance of the other portions is 0%. When the ratio is 100%, there is no mode selectivity and the likelihood that the zero order mode will be selected is reduced. From FIG. 5, it can be seen that when the width 2B of the high reflectance region 4 is 40 to 70 microns for a width 2T of the active region of 150 microns, the selectivity is enhanced.

Figure 6:
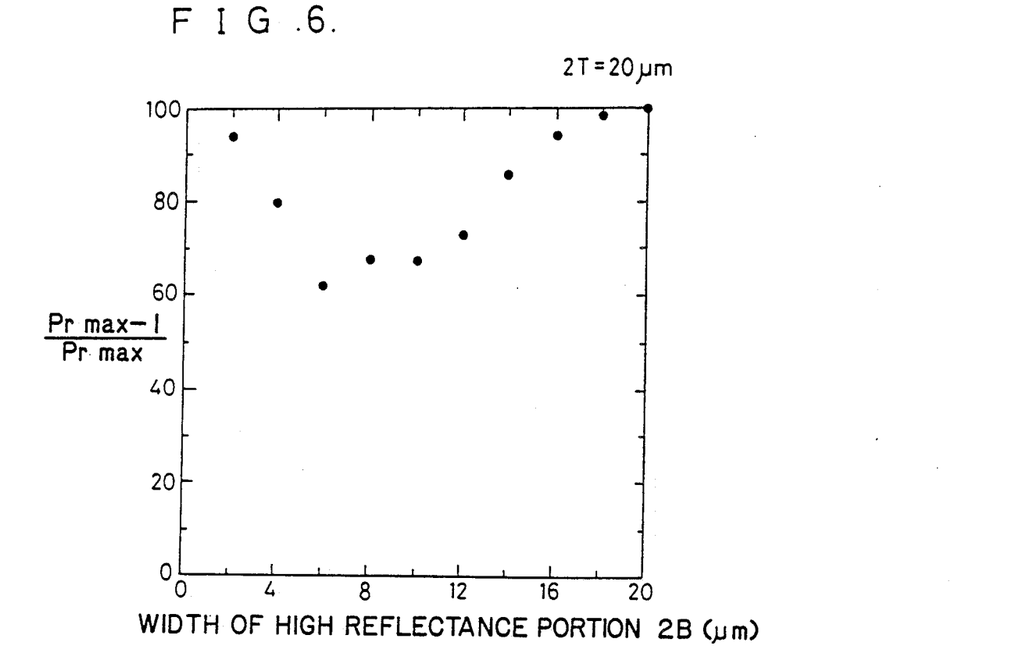
Figure 7:
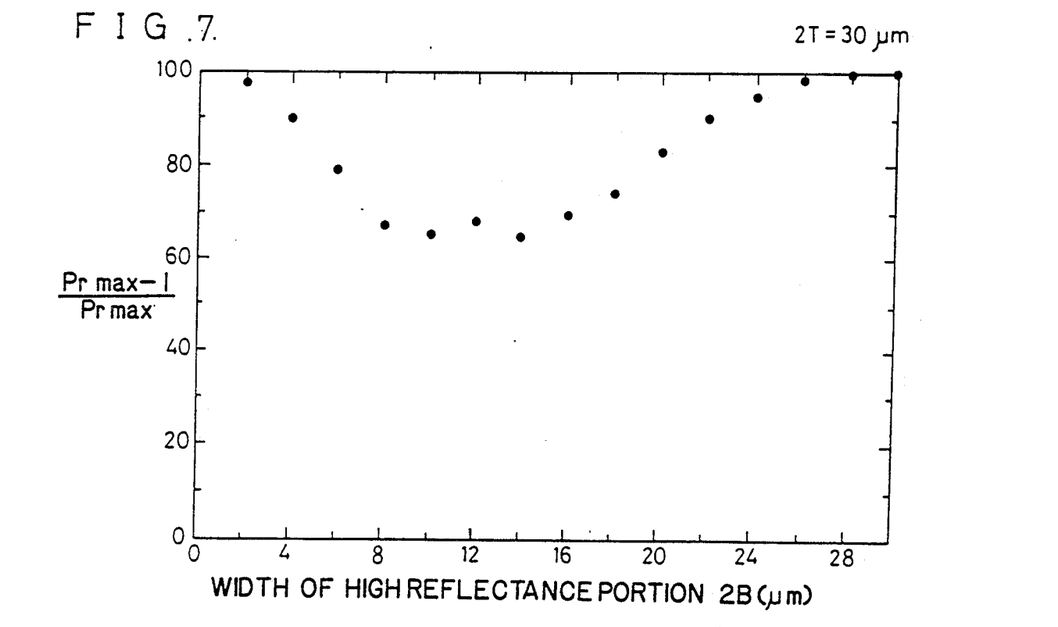
Figure 8:
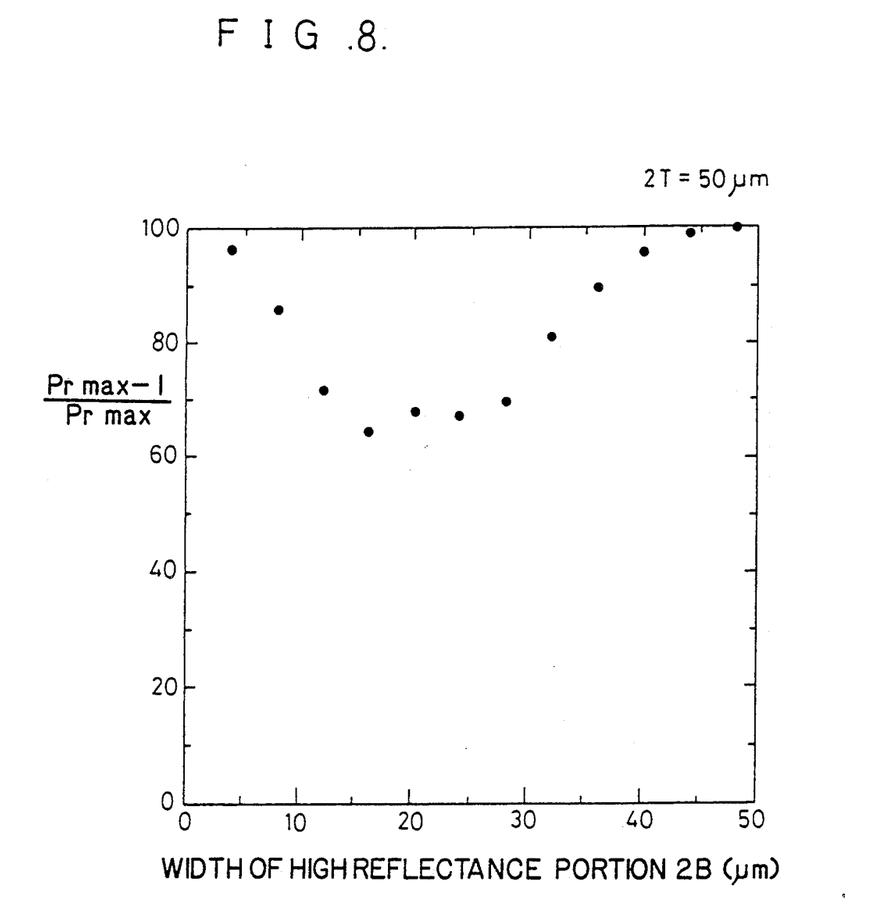

A similar calculation for active region widths 2T of 20 microns, 30 microns, and 50 microns, and the respective properties are shown in FIGS. 6, 7, and 8. In all cases, when about ⅓ of width 2T of the active region is a high likelihood of a mode of oscillation in addition to the fundamental mode can be reduced to about 60 to 70% of the fundamental mode, similar to the case of FIG. 5. Thus, the width of the high reflectance portion 4 is most effective when it is about 1/5 to ½ of the width of the laser waveguide 1.

The threshold gain g in a semiconductor laser of front facet reflectance Rf, rear facet reflectance Rr, scattering and absorption loss $\alpha(cm^{-1})$, and cavity length L is approximately given by the following formula.

$$g_t = \alpha - \frac{\ln Rf Rr}{2L}$$

When the SBA laser having an active region of 150 microns width is considered, $\alpha = 10$ cm$^{-1}$, L = 500 microns, and a threshold gain of $g_{t0} = 10 - 10\ln(Rf\,Rr)$ is required for the fundamental mode. On the contrary, when a high reflectance portion of 50 microns width corresponding to ⅓ of 150 microns is produced, as seen from FIG. 5, the front facet reflectance against the mode (mode X) which is likely to oscillate followed by after or in addition to the fundamental mode becomes 0.655 Rf of that of the fundamental mode. The gain $g_{tx}$ required for the oscillation of the mode X is given by the following formula.

$$\begin{aligned}
g_{tx} &= 10 - 10 \cdot \ln(0.655\ Rf\,Rr) \\
&= 10 - 10 \cdot \ln(Rf\,Rr) - 10\ln(0.655) \\
&= g_{t0} - 10\ln(0.655) \\
&= g_{t0} + 4.2
\end{aligned}$$

As seen from this formula, the gain $g_t$ is larger by 4.2 cm$^{-1}$ than the threshold gain required for the fundamental mode,. This gain difference of 4.2 cm$^{-1}$ is sufficient protection against variations in device processing and defects in crystalline structure, and the like and fundamental mode oscillation can be reliably obtained.

Next, the production method of the facet reflectance film in the present embodiment will be described.

The production method of the facet reflectance film in the present embodiment is fundamentally the same as the usual production method. However, there is a difference in that the high reflectance portion is deposited only at a portion of the facet. A low reflectance coating is deposited and thereafter a high reflectance portion is deposited in a usual production process.

When the refractive index of the dielectric coating material is $\sqrt{Neff}$ (herein, Neff is an equivalent refractive index in the semiconductor crystal for the mode under consideration, and in AlGaAs series lasers it is generally 3.4 to 3.5), by making the thickness of the dielectric material film ¼ wavelength of the wavelength $\lambda_0$ of the light under consideration or an odd multiple thereof, the reflectance can be made the lowest value, that is, zero. For example, for light of 0.8 microns wavelength, by making the thickness of the dielectric material film having refractive index of 1.85 0.108 microns or 0.324 microns . . . , the reflectance can be made zero. $Al_2O_3 (N \approx 1.76)$ or $Si_3N_4 (N \approx 1.9)$ can be employed for the dielectric material film. These materials are deposited to a desired thickness on a facet of a semiconductor laser device by an electron beam deposition method or a plasma CVD method, thereby producing a low reflectance portion 21.

The high reflectance portion 4 is produced by a multilayer coating of $SiO_2$ and a-Si (amorphous silicon). Usually a reflectance of up to about 95% can be easily obtained with several layers. In order to produce this multi-layer at a desired portion of the laser facet while controlling the width thereof, at first a wafer is cleaved to produce a plurality of laser chips attached together. The cleared chips are mounted onto a flat surface, such as glass plate, with the facets to be coated directed upwards from the surface. A resist may be used for the mounting. Next, the low reflectance coating layer 21 is deposited on the facet followed by the above-described process. Next, resist is deposited on the entire surface thereof, and exposed in a desired width at the central portion of the stripe (active layer). The resist is developed to remove the resist only at the exposed portion. The above-described SiO$_2$/a-Si layer is deposited in this state by, for example, an electron beam deposition method. Thereafter, the remaining resist is removed by a solvent such as acetone. The SiO$_2$/a-Si layer deposited on the resist is lifted off with the resist, thereby producing a SiO$_2$/a-Si layer only at the central portion of the stripe.

The most difficult point in this method resides in accurately aligning the pattern with the central portion of the stripe only 150 microns width. Although the stripe can be easily seen from the surface of the chip, when the patterning is conducted on the facet, the stripe can hardly be seen. Therefore, mesa etching for separating the chips from each other is carried out for the wafer. Then, the mesa etched position can be seen as a V groove configuration from the facet direction of the chips, and the pattern location determination can easily be made. Accordingly, when the pattern is aligned with this mesa etched portion, a pattern of a desired width can be placed at the central portion of each stripe automatically.

In this embodiment, since photolithography is carried out with a resist on the facet, the control of the resist thickness is more difficult than in the usual case. The precision of the pattern width is about ±3 microns. Furthermore, since the position of the pattern is aligned with the V-shaped groove produced by the mesa etching, the positional precision will be ±2 microns. However, as shown in FIG. 5, an error of ±10 to ±15 microns in the width of the high reflectance portion, is acceptable.

Figure 4A:
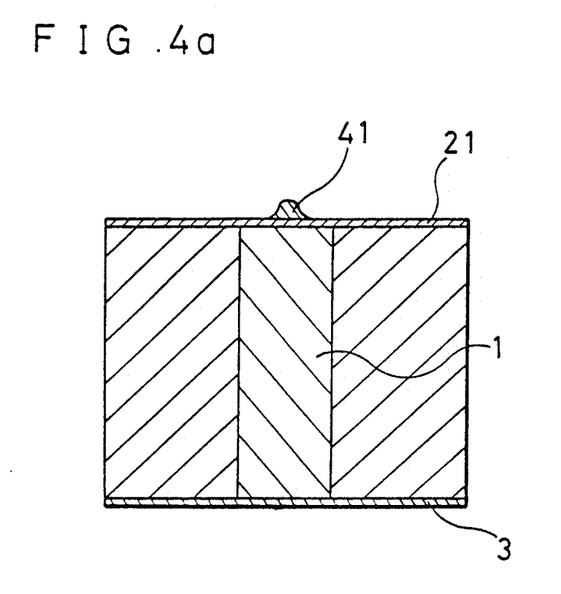
FIGS. 4(a) and 4(b) are diagrams showing a semiconductor laser device according to a second embodiment of the present invention.
Figure 4B:
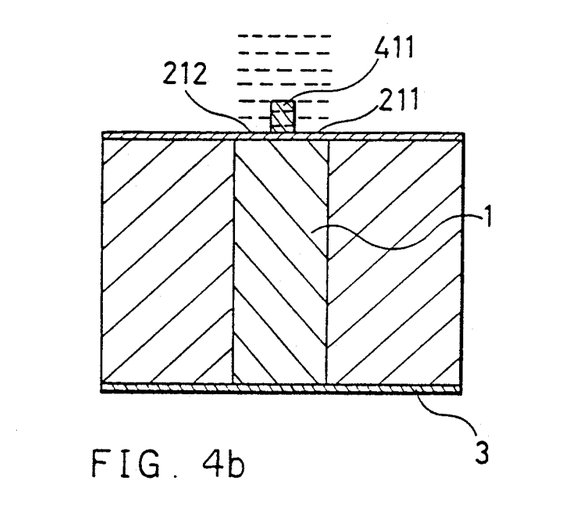

FIGS. 4(a) and 4(b) show other embodiments of the present invention, respectively.

In the embodiment of FIG. 1(a) the side surfaces of the high reflectance portions 4 are perpendicular to the facet of the laser, thereby producing interference fringes in far filed pattern as shown in FIG. 2. In the embodiment of FIG. 4(a), however, the side surface of the high reflectance portion 41 are sloped, thereby reducing the fringes.

In the embodiment of FIG. 4(b), while the thickness of the high reflectance portions 411 is chosen to produce a desired reflectance, the reflectance of the low reflectance portions 211 and 212 and that of the high reflectance portion 411 are properly adjusted so that the wave fronts of the light emitted from the both portions are aligned, thereby reducing the fringes. That is, the high reflectance portion 411 generally produces reflections because of the refractive index difference between the high reflectance portion 411 and the outside. The reflectance of the entire device is determined by the phase relationship between the light which is reflected at the surface of the portion 411 and the light which is reflected at the interface between the layer 411 and the laser crystal. Since this reflectance is periodically increased and lowered when the thickness of the high reflectance portion 411 is increased, it is possible to choose a thickness which satisfies the desired reflectance and which reduces fringes at the same time.

For example, when a region of high reflectance portion 411 has a thickness of 1.5 microns of material having a refractive index of 1.5 for light of wavelength 750 nm, the light which is emitted from the low reflectance portions 211 and 212 and propagated through external space has already traveled a distance corresponding to two wavelengths when the light reaches the emission plane of the high reflectance portion 411. This light has the same phase as the light at the emission surface. On the other hand, the light propagated from the high reflectance portion 411 travels three wavelengths in 1.5 microns, and has the same phase as the light emitted from the surface of the low reflectance portion. Accordingly, the light emitted from the high reflectance portion 411 and the light emitted from the low reflectance portions 211 and 212 will achieve the same phase when propagated into space. Accordingly, the fringes in the far radiation pattern become small and light can be effectively concentrated at the center of the beam. In other words, the utilization efficiency of the light is increased.

While in the above-described embodiment a BH (Buried Heterojunction) type laser is described, the present invention may be applied to lasers having other stripe configurations such as an SBH (Strip Buried Heterojunction) type laser, an SAS (Self-Aligned Structure) type laser, or an electrode stripe type laser.

The term "light waveguide" is used here instead of "active layer" because it is not important where the generation and amplification of light in the present invention. Rather, it is important how the light is guided. In other words, the present invention may be applied to an LOC structure, such as a semiconductor laser structure, in which the active layer is overlaid on a light guide and the active layer is absent at the facets so that only the light waveguide is exposed at the facets.

While in the above-illustrated embodiment photolithography is used for producing a high reflectance region having a narrow width on the laser facet, this region may be produced by direct deposition using a patterned metal mask. In this case, since the side surfaces of the high reflectance portion are sloped, there arises no large fringes in the emitted laser light. However, the positional precision in the deposition mask method is generally worse than that of the photolithography technique and is about ±10 microns.

As is evident from the foregoing description, according to the present invention, at least one facet of a light waveguide includes a high reflectance region having a width of about 1/5 to ½ of the width of the light waveguide and located at the central portion of the light waveguide. A low reflectance region having a lower reflectance than the high reflectance region is located on both side of the high reflectance region, resulting in oscillation mode selectivity. Accordingly, even in a high power output semiconductor laser device having a wide light waveguide, the fundamental transverse mode of oscillation is easily obtained. Thus, when the fundamental mode is obtained, the light can be focused to a point by a lens. The entire light beam power can be concentrated on a small spot, the area of which is determined by the characteristics of the optical system, thereby achieving fundamental mode oscillation even in optical recording, and further achieving a high efficiency wavelength conversion by irradiating such laser light on SGH material.

What is claimed is:

1. In a semiconductor laser device having a light waveguide through which a higher order transverse mode of oscillation can propagate, a first facet through which laser light is emitted, and a second facet opposite the first facet on which a reflective coating is disposed, a relatively high reflectance coating having a width of about 1/5 to ½ of the width of said light waveguide disposed centrally on the first facet and a relatively low reflectance coating having a lower reflectance than said high reflectance coating disposed on the first facet at both sides of said high reflectance coating.

2. A semiconductor laser device as defined in claim 1 wherein the reflectances of said high reflection coating and said low reflection coating smoothly vary at a boundary therebetween.

3. A semiconductor laser device as defined in claim 1 wherein said high reflectance coating and said low reflectance coating include first and second dielectric films, respectively, and the thicknesses of the first and second dielectric films are chosen, considering the respective refractive indices of the first and second films and the wavelength of light emitted by the laser, so that laser light emitted through said high reflectance coating has the same phase as laser light emitted through said low reflectance coating at the surface of said high reflectance coating through which light emitted by the laser exits the high reflectance coating.

4. In a semiconductor laser including an internal light waveguide having a width and a thickness, the width being much larger than the thickness, the waveguide supporting multiple modes of oscillation for the generation of laser light, a first facet through which laser light is emitted, a second facet opposite the first facet on which a reflective coating is disposed, and a first coating disposed on the first facet having a relatively low reflectance and a second coating disposed on part of the first coating transverse to and centrally disposed relative to the width of the waveguide, the second coating having a relatively high reflectance and a width generally parallel to the width of the waveguide of about 1/5 to ½ of the width of the waveguide, whereby the higher reflectivity of the first facet at the central portion of the waveguide sustains the fundamental mode of oscillation in the laser and the lower reflectivity of the first facet outside the central portion of the waveguide suppresses higher order modes of oscillation in the laser.

5. The semiconductor laser structure of claim 4 wherein the second coating has a generally planar front wall through which light is emitted disposed generally parallel to the first facet and generally planar side walls disposed generally perpendicular to the first facet.

6. The semiconductor laser structure of claim 4 wherein the second coating has a front wall generally parallel to the first facet and smooth side walls extending from the first facet to the front wall.

7. The semiconductor laser structure of claim 4 wherein the optical thickness of the first coating, considering its refractive index and the wavelength of the laser light passing through it, and the optical thickness of the second coating, considering its refractive index and the wavelength of the laser light passing through it, are interrelated so that the laser light emitted through the first and second coatings has the same phase at the surface of the second coating through which light emitted by the laser exits the second coating.

* * * * *